March 29, 1960 H. M. KRIEGER 2,930,989

BLOCKING TRANSISTOR OSCILLATORS AND AMPLIFIERS

Filed April 1, 1957

INVENTOR.
HAROLD M. KRIEGER
BY
Robinson & Berry
ATTORNEYS

United States Patent Office 2,930,989

Patented Mar. 29, 1960

2,930,989

BLOCKING TRANSISTOR OSCILLATORS AND AMPLIFIERS

Harold M. Krieger, Seattle, Wash.

Application April 1, 1957, Serial No. 649,720

2 Claims. (Cl. 331—112)

This invention relates to improvements in oscillators and amplifiers. More particularly, it relates to blocking transistor oscillators and amplifiers as applied to warning lights or to similar devices that are electronically controlled as differentiated from those that have controls of a mechanical or thermal nature.

It is the principal object of this invention to provide an improved low-powered, self-excited period blocking transistor oscillator of novel character, powered by a small battery for the operation of a flashing warning signal light.

A further object of the invention is to provide an oscillator of the above stated character comprising means whereby the "on" and "off" time intervals and the repetition rate may be made continuously variable, or may be fixed.

Another object of the present invention is to provide an oscillator of the above stated character that is especially adapted for use in connection with advertising displays, decorations, signal lights, electric fences and various analogous uses and which is characterized by the fact that it has no moving parts; in that it has no bearings that require oiling, and has no contact points or parts to become affected by dirt, corrosion, or excessive moisture.

Further objects and advantages of the present invention reside in the details of construction and combination of parts and in its mode of operation as will hereinafter be fully described.

In accomplishing the above mentioned and other objects of the invention, I have provided the improved details of construction, the preferred forms of which are illustrated in the accompanying drawings, wherein.

Figs. 4, 5, 6 and 7, respectively, show blocking transistor oscillator wave forms in various parts of the circuit.

The various layouts herein illustrated are basically the same in principle of operation although not employing the same circuitry or hook-up. For explanatory purposes, a PNP transistor has been used. However, an NPN transistor could be used equally as well, providing that all polarities are changed accordingly.

Figure 1:
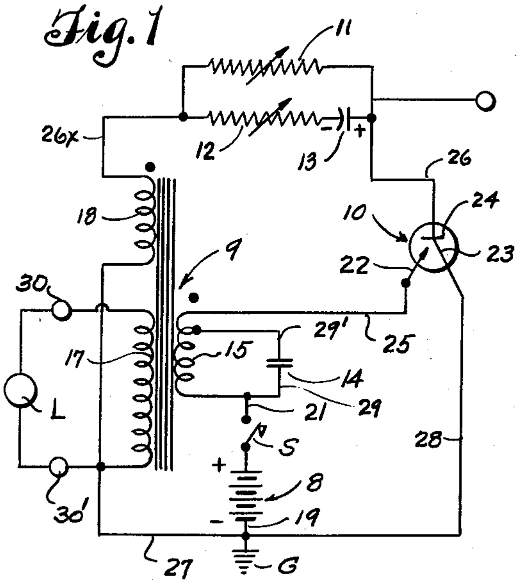
Fig. 1 is a schematic circuit layout of a blocking transistor oscillator, embodied by the present invention, showing the power furnishing battery as located in the emitter to collector circuit and with the control components in the base circuit.

Referring first to the circuitry and devices of Fig. 1: The principal elements employed in this particular system are the powering battery designated by reference numeral 8, a transformer designated in its entirety by reference numeral 9, a transistor designated generally by numeral 10, resistors 11 and 12 and condensers 13 and 14.

As herein shown, the transformer 9 comprises a primary winding 15 and secondary windings 17 and 18; the secondary winding 17 being designated hereinafter as the "output winding" and the secondary winding 18 being hereinafter designated as the "feed back winding."

The battery 8 has its negative pole grounded by a lead 19 that is grounded at G, and its positive pole is connected through a switch S and a lead 21 with one terminal of the primary winding 15.

The transistor 10 comprises an emitter electrode 22, a collector electrode 23 and base electrode 24. The emitter electrode 22 is connected by a lead 25 with the other terminal of the primary winding 15. The base electrode 24 of the transistor is based through a lead 26 and parallel connected RC network electrolytic condenser 13 and resistor 11. The resistor 12 is shown as being connected in series with condenser 13 and resistor 11 is connected by lead 26*x* to one end of the feed back winding 18. Winding 18 is connected at its other end by a lead 27, with ground G. The collector electrode 23 of the transistor 10 also is connected to ground G; this being by a lead designated at 28.

The transformer windings 15 and 18 are connected in the same phase, and impedance matched to the transistor elements. The condenser 14 is connected at one side to that end of winding 15 which is adjacent to switch S by a lead 29, and a lead 29′ from its other side is connected across approximately two-thirds of the primary winding 15, as shown.

The output winding 17 of the transformer has one end grounded by direct connection with the lead 27. This end may be ungrounded, but is here shown as being grounded.

The representative values of the principal components employed in the system of Fig. 1 preferably are as follows: The powering battery is one of six volts. The transformer 9 has a ratio of 100 to 1 in respect to winding 15. The condenser 13 has a value of 100 microfarads and condenser 14 one of 5 microfarads. Resistors 11 and 12 have values of 2500 ohms and 5000 ohms, respectively.

This system, as shown in Fig. 1, is used with a suitable type of flasher signal lamp as designated at L; this lamp being connected across the terminals 30—30′ of the output winding 17 as indicated.

Variations of the load across terminals 30—30′ could be either another transformer winding, transmission line, resistor, incandescent lamp or a gas discharge tube depending upon the power output and the turns ratio between output winding 17 and primary winding 15.

Variations of uses for these pulse oscillator circuits could also be to synchronize other oscillators, timing devices for computers, variable time delay, variable pulse and variable pulse group length generator, high voltage power supply, frequency divider, medical shock treatment devices and similar uses.

The oscillator operates similarly to an electronic tube circuit in that upon closing the switch S oscillating current flows through the transformer winding 15, thence through the transistor 10 and lead 26 and charges the condenser 13, polarized so that the positive terminal is attached to base 24, and in conjunction with the resistor 11, the RC time constant of this combination controls the effective capacity of the condenser 13, the repetition rate of each complete cycle of operation; this being accomplished because the voltage amplitude across the condenser 13 becomes high enough to cut off emitter current flow and is about twice that of the instantaneous battery voltage.

The resistor 11, as connected in parallel with the condenser 13, controls the discharge rate of the condenser, which effectively controls the "repetition rate" at which each train of pulses occurs. Decreasing the resistance of resistor 11 increases the rate at which each group of pulses repeats itself. Effectively, the resistor 11 controls the "off time" and the complete cycling rate.

The resistor 12 controls the number of pulses permitted before the RC charging time of resistor 11 and condenser 13 is high enough in amplitude to cause cessation of oscillations. Increasing the resistance of resistor 12 increases the number of pulses per group and vice versa. In other words, resistor 12 controls the number of pulses per group which is the "on" time.

In the system of Fig. 1, resistors 11 and 12 are somewhat inter-dependent. However, adjustments can be made to obtain a myriad of modes of operation as to the number of pulses "on" time, length of "off" time and the repetition rate.

Since windings 18 and 15 are properly phased, in phase, oscillations are maintained until the base voltage is built up high enough to cut off the collector current, and since primary winding 15 is also inductively coupled to the output winding 17, power may be taken therefrom. Condenser 14 may be omitted. However, its use will provide a smoother cycling operation and flasher rate. Without its use the value of condenser 13 would have to be increased considerably.

Figure 2:
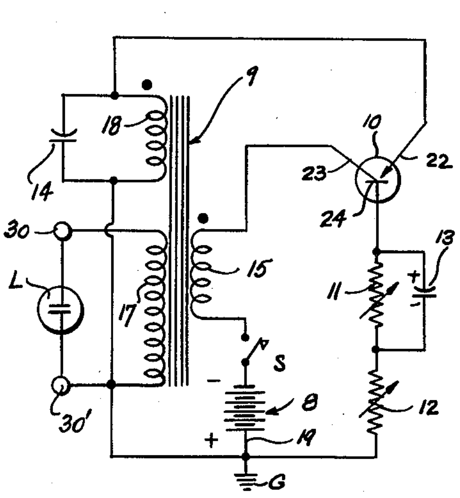
Fig. 2 is an alternative schematic circuit layout of the blocking transistor oscillator of this invention, somewhat different in its circuitry but with the powering battery in the emitter to collector circuit, and the control components in the base circuit.

Referring now to the system of Fig. 2: In this illustration, parts that are like those of Fig. 1 have been given the same reference characters. The oscillator here shown operates similarly to that of Fig. 1 except in this the timing components 11, 12 and 13 have been placed between the base electrode 24 of the transistor 10 and ground G; the collector electrode 23 has been connected through winding 15 and switch S to the negative pole of battery 8 which has its positive pole connected by lead 19 to ground return G, and the condenser 14 may, as shown, be placed across the terminals of winding 18.

The operation of the system of Fig. 2 is like that of Fig. 1 in that as the positive voltage is built up between the base electrode 24 and emitter electrode 22, the oscillations will stop, and start over again after being dissipated through resistors 11 and 12. The gas discharge tube L is connected across the terminals of the output coil 17 and will discharge with a glow of light as long as the oscillator generates pulses. The number of pulses in each group, the "on" time and the spacing between groups of pulses, and rapidity with which this procedure occurs is controlled, as in the system of Fig. 1, by condenser 13 and resistors 11 and 12.

The continuous operating frequency of this oscillator is primarily dependent upon the inductance of windings 15 and 18, and the condenser 14. It is about 110 cycles per second.

Figures 3, 4, 5, 6, 7:
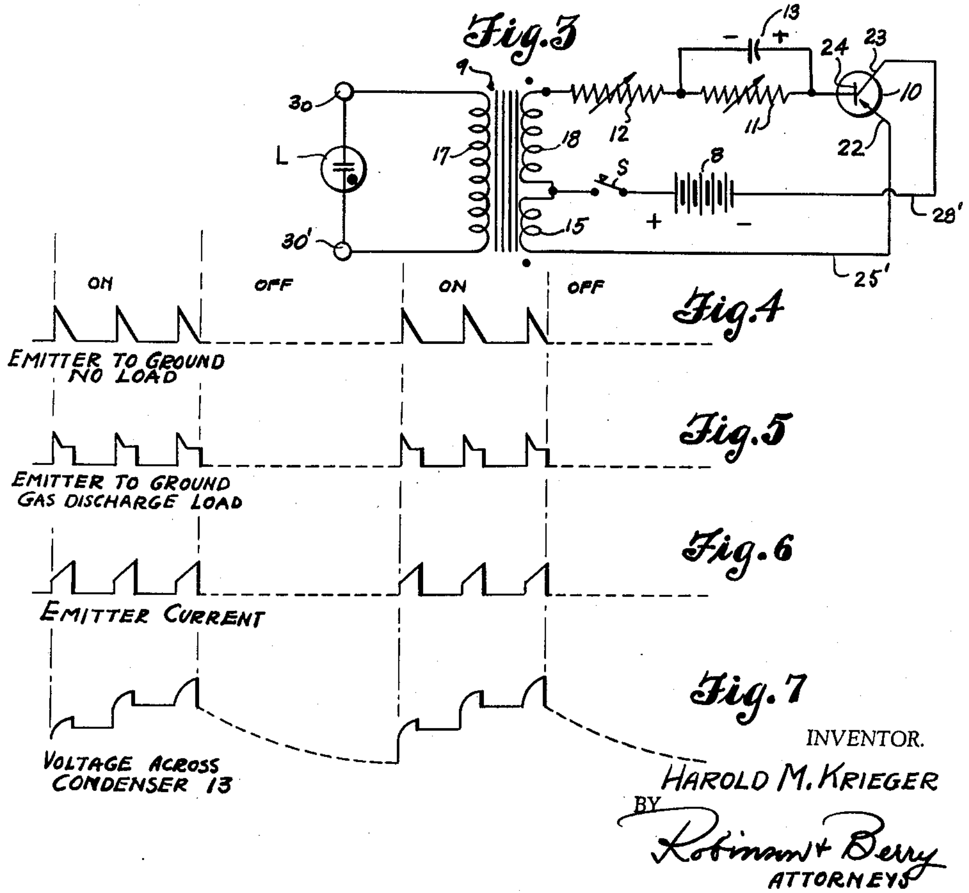
Fig. 3 is another alternative schematic circuit layout, similar to those of Figs. 1 and 2 except that the powering battery is common to both the base and emitter circuits, with the negative side of the battery connected to the collector and with the control components in the base circuit.

Referring now to the system of Fig. 3, in this the operation is the same as previously described, but various components have been placed in different parts of the circuit and their values have been slightly changed for proper current and impedance matching. Components which are like those of Figs. 1 and 2 have been given the same reference numerals.

In this circuitry, the load L has opposite sides connected to the terminals of winding 17. Also, it is noted that the resistors 11 and 12 are in series connection, and the condenser 13 is connected across the resistor 11. The negative side of battery 8 is connected by lead 28' with the collector electrode 23 of the transistor and its positive side can be connected through switch S with terminals of the transformer windings 15 and 18; the other terminal of winding 15 being connected through lead 25'' with the emitter electrode 22 and the other terminal of winding 18 being connected to one side of resistor 12 as shown.

Ordinarily, as the battery voltage diminshes the amplitude of oscillations becomes lower, therefore, the charge across condenser 13 becomes less which will slow down the repetition rate of the group of pulses, however, the circuit of Fig. 3 has a decided advantage over the other two in that an automatic control arrangement is had, because as the voltage of battery 8 decreases down to as low as ⅓ of its initial fully charged state the repetition rate of the pulsed group of signals will remain unchanged.

Referring to Fig. 3: by connecting the positive side of battery 8 to the return circuit of the base 24 acts as a bucking voltage so that as the oscillations become weaker, as the battery becomes weaker, the flasher rate, or the repetition rate is held constant, making the circuit of Fig. 3 the most desirable.

It is further to be explained that the value of the component parts in any one circuit arrangement may be changed, thereby changing the method of operation only as required to meet a circuit need or requirement, but without departing from the essence of the invention.

In reference to Figs. 4, 5, 6 and 7:

Fig. 4 is representative of the wave forms of the blocking oscillator between emitter and ground with no load when the control circuits are adjusted to three pulses per group.

Fig. 5 is representative of and comparable to the wave forms in Fig. 4 appearing between emitter and ground except that a gas discharge tube load is placed across the winding 17.

Fig. 6 represents emitter current pulses drawn from the battery.

Fig. 7 represents the voltage across the condenser 13, illustrating how the positive D.C. voltage is built up across condenser 13 until collector current cut-off is reached, then the D.C. potential dissipates to zero through resistor 11, then the oscillations repeat.

In Figs. 4, 5, 6 and 7, two complete cycles of three pulses each are shown and also those of all views are on the same timing scale. The "off" part of the cycle, or group, can be less or much greater in proportion than shown as indicated by the horizontal dash lines.

These circuits when used with high frequency transistors and/or powered iron core coils or air coils can be operated into the megacycles in the manner described above, and the oscillators of Figs. 1, 2 and 3 can also be synchronized by applying a small negative voltage across the control circuit resistor 11, resistor 12 and condenser 13. These circuits may also be triggered by first applying a positive voltage across the control components resistor 11, resistor 12 and condenser 13, non-oscillating condition, then by either reducing the positive voltage to zero or applying a negative pulse the oscillations will start.

The numerous amount of turns of winding 21 may produce an output voltage of around 4,000 volts when used with a gas discharge device, as a warning signal light. When adjusting the control circuit, in particular resistor 12, the more pulses per group the longer the signal light will remain on as it flashes on and off.

If desired, voltage pulses may be taken from other parts of the oscillatory circuit, possibly making transformer winding 17 unnecessary. Useful voltage pulses of the wave shapes as shown may be taken from corresponding points and also from the junction of resistor 11 and resistor 12 and winding 18 in Fig. 1 or any other part of the blocking transistor oscillator as may be desired.

I claim:

1. A pulse generator of the type including a transistor having base, emitter and collector electrodes, a control network system connected to said base electrode and including a capacitor and a resistor connected in parallel to each other for controlling the repetition rate of each complete cycle and a second resistor connected in series to the first mentioned resistor and capacitor for controlling the number of pulses per complete cycle, a source of electrical energy connected to said collector electrode, a transformer having a feed back winding connected to said control network system and to said source of electrical energy and having a primary winding connected between said source of electrical energy and said emitter electrode.

2. A pulse generator of the type including a transistor having base, emitter and collector electrodes, said base, emitter and collector electrodes having a common connection, a transformer coupling said emitter electrode with one of the other of said electrodes between such common connection and the respective electrodes, a control network connected between said common connection and said base, and a source of electrical energy connected between said emitter and collector electrodes through said common connection, said control network including a timing capacitor and a parallel resistor through which said capacitor discharges, and a second resistor connected in series to the capacitor and first resistor to control the cycling rate of the generator, said transformer providing a coupling between said emitter and base electrodes, said timing capacitor and first resistor being connected in series and said second resistor being connected in parallel thereto.

References Cited in the file of this patent

UNITED STATES PATENTS

| | | |
|---|---|---|
| 2,086,668 | Fodor | July 13, 1937 |
| 2,300,916 | Furedy | Nov. 3, 1942 |
| 2,358,297 | Bedford | Sept. 19, 1944 |
| 2,447,304 | Atkins | Aug. 17, 1948 |
| 2,488,169 | Browner | Nov. 15, 1949 |
| 2,582,603 | Phelan | Jan. 15, 1952 |
| 2,681,996 | Wallace | June 22, 1954 |
| 2,701,309 | Barney | Feb. 1, 1955 |
| 2,727,146 | Fromm | Dec. 13, 1955 |
| 2,745,012 | Felker | May 8, 1956 |
| 2,843,744 | Guyton | July 15, 1958 |

OTHER REFERENCES

"Transistor Power Supplies," by L. H. Light, Wireless World, December 1955, pp. 582–586.